(12) United States Patent
Suzuki et al.

(10) Patent No.: US 10,242,896 B2
(45) Date of Patent: Mar. 26, 2019

(54) SUBSTRATE STORAGE CONTAINER (71) Applicant: SHIN-ETSU POLYMER CO.,LTD., Tokyo (JP)

(72) Inventors: Tsutomu Suzuki, Saitama (JP); Satoshi Odashima, Saitama (JP); Hiroshi Mimura, Kawagoe (JP); Osamu Ogawa, Saitama (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 987 days.

(21) Appl. No.: 14/376,964

(22) PCT Filed: Apr. 1, 2013

(86) PCT No.: PCT/JP2013/060012
§ 371 (c)(1),
(2) Date: Aug. 6, 2014

(87) PCT Pub. No.: WO2013/151022
PCT Pub. Date: Oct. 10, 2013

(65) Prior Publication Data
US 2015/0014191 A1    Jan. 15, 2015

(30) Foreign Application Priority Data

Apr. 4, 2012 (JP) ................................ 2012-085169

(51) Int. Cl.
*H01L 21/673* (2006.01)
(52) U.S. Cl.
CPC .. *H01L 21/67393* (2013.01); *H01L 21/67366* (2013.01)

(58) Field of Classification Search
CPC .................... H01L 21/67393; H01L 21/67366
See application file for complete search history.

(56) References Cited

U.S. PATENT DOCUMENTS 6,544,610 B1 *  4/2003  Minami ................. B32B 27/08
                                                            428/35.7
6,682,797 B1    1/2004  Otoi et al.
(Continued)

FOREIGN PATENT DOCUMENTS

JP    A-2004-011721    1/2004
JP    A-2004-107472    4/2004
(Continued)

OTHER PUBLICATIONS

Machine Translation of JP 2009184681 A; 2009.*
(Continued)

*Primary Examiner* — James C Yager
(74) *Attorney, Agent, or Firm* — Oliff PLC (57) ABSTRACT

To provide a substrate storage container capable of keeping low a relative humidity in an internal closed space for a long period of time even after purging, a substrate storage container including a constitutive material, which includes a shell body, a door and an on-off valve, defining the internal closed space, the constitutive material being formed of a specific constitutive material having a water absorption of 0.1 wt. % or less when immersed in water at 23 degree C. for 24 hours, and thereby, an actual requirement is objectively satisfied in terms of water release suppression ability under JIS K 7209 or ISO 62 to significantly suppress releasing of water into the internal closed space 3 through the shell body, the door and the on-off valve.

8 Claims, 2 Drawing Sheets

(56) References Cited

U.S. PATENT DOCUMENTS

| | | | |
|---|---|---|---|
| 6,703,184 B1 | 3/2004 | Preuss et al. | |
| 2002/0135966 A1 | 9/2002 | Tanaka et al. | |
| 2004/0017954 A1 | 1/2004 | Komori et al. | |
| 2012/0103860 A1* | 5/2012 | Masuko | G03F 1/66 |
| | | | 206/524.6 |

FOREIGN PATENT DOCUMENTS

| | | | | | |
|---|---|---|---|---|---|
| JP | A-2004-285147 | | 10/2004 | | |
| JP | A-2005-225126 | | 8/2005 | | |
| JP | 2007002155 A | * | 1/2007 | | |
| JP | A-2007-002155 | | 1/2007 | | |
| JP | A-2007-012793 | | 1/2007 | | |
| JP | A-2008-156401 | | 7/2008 | | |
| JP | 2009184681 A | * | 8/2009 | | |
| JP | A-2009-246154 | | 10/2009 | | |
| JP | 2011018771 A | * | 1/2011 | | G03F 1/66 |
| JP | A-2011-009241 | | 1/2011 | | |
| JP | A-2011-018771 | | 1/2011 | | |
| JP | A-2012-224724 | | 11/2012 | | |
| TW | 561128 B | | 11/2003 | | |
| WO | WO 02/093622 A2 | | 11/2002 | | |
| WO | 2011/004729 A1 | | 1/2011 | | |

OTHER PUBLICATIONS

Machine Translation of JP 2007002155 A;2007.*
Aug. 3, 2016, Office Action in Japanese Patent Application No. 2014-509159.
Aug. 22, 2016 Office Action issued in Twainese Patent Application No. 102112232.
May 27, 2016 Office Action issued in Chinese Patent Application No. 201380011256.6.
May 21, 2013 International Search Report issued in International Application No. PCT/JP2013/060012.
Oct. 4, 2014 Translation of International Preliminary Report on Patentability issued in International Application No. PCT/JP2013/060012.
Jan. 20, 2017 Office Action issued in Chinese Patent Application No. 201380011256.6.
Oct. 7, 2015 Extended European Search Report issued in European Patent Application No. 13772864.8.

* cited by examiner

SUBSTRATE STORAGE CONTAINER

TECHNICAL FIELD

The present invention is related to a substrate storage container for use during transport and storage within a manufacturing process, or inter-plant transport, of a substrate for electronic devices such as a semiconductor wafer of silicon or the like, a glass wafer, a mask glass, a liquid crystal device, or the like.

BACKGROUND ART

In association with miniaturization and development of high integration of various semiconductor devices, the influence of various contaminants such as a particle, an organic matter, acid and basic substances, and the like, due to manufacturing environmental factors in a clean room, on the silicon wafer which is carried in a device process, is becoming more problematic.

With regard to this situation, in the semiconductor process, with the wafer diameter having become 300 mm in particular, a system called local-environment (mini-environment) which houses the silicon wafer in a closed container, and carries between manufacturing apparatuses and stores have come to be employed. A substrate storage container made of a plastic mainly is used widely as the transport and storage container.

Specifically, the substrate storage container is formed using of a synthetic resin such as a polypropylene, a polycarbonate, a cyclic olefin polymer, or the like. In particular, as a storage container for housing the 300 mm wafer (substrate), the storage container made of a polycarbonate resin is used mainly, because it has a high rigidity and the inside is visible.

Further, when using the substrate storage container, in order to prevent oxidation of the substrate surface to be housed therein and promotion of excess reaction during processing, and to prevent contamination due to adhesion of organic substances through water, it is proposed to replace the gas inside the substrate storage container with an inert gas such as nitrogen gas or dry air.

By using such a substrate storage container, the influence of various contaminants such as a particle, an organic matter, acid and basic substances, and the like, due to manufacturing environmental factors in a clean room can be reduced, as disclosed in Japanese Laid-open Patent Application Publication No. 2009-246154, for example.

However, on the other hand, in recent years, with increasing miniaturization of circuit patterns, in a metal process among device processes for example, it is becoming apparent that a relative humidity, that is, water content in the surrounding environment of the wafer, has great influence on the yield. It is necessary to reduce the relative humidity by substituting (purging) the air in the internal closed space of the substrate storage container with dry nitrogen or the like, and then to make it possible to keep low the relative humidity in the internal closed space of the substrate storage container as it is for a long period of time. In this respect, because the water absorption of the polycarbonate which has been mainly used as a material of the conventional substrate storage container is high, it is difficult to keep low the relative humidity in the internal closed space of the substrate storage container as it is for a long period of time after reducing the relative humidity by substituting (purging) the air in the internal closed space of the substrate storage container with dry nitrogen or the like.

CITATION LIST

Patent Literature

Patent Literature 1: Japanese Laid-open Patent Application Publication No. 2009-246154

SUMMARY OF INVENTION

Technical Problem

The present invention has been accomplished in view of the circumstances described above. It is an object of the present invention to provide a substrate storage container capable of keeping low a relative humidity for a long period of time even after purging.

Solution to Problem

The above described object is achieved by the following configurations (1) to (7) according to the present invention.
(1) In accordance with an aspect of the present invention, provided is a substrate storage container for storing a substrate in an internal closed space thereof, comprising a constitutive material defining the internal closed space, the constitutive material being formed of a specific constitutive material having a water absorption of 0.1 wt. % or less when immersed in water at 23 degree C. for 24 hours.
(2) Preferably, the internal closed space is set so that a relative humidity therein remains at 10% or less based on the specific constitutive material when let stand in nature for 24 hours on a starting basis of a state of the relative humidity of 0%.
(3) Preferably, the specific constitutive material comprises: a cyclic olefin resin (A component) of 100 parts by mass; a fibrous conductive filler (B component) of 3 to 25 parts by mass to the A component of 100 parts by mass; and a polyolefin-based and/or a polystyrene-based thermoplastic elastomer as an impact resistance improver (C component) of 5 to 25 parts by mass to the A component of 100 parts by mass.
(4) Preferably, the specific constitutive material has a surface resistance value of $1.0 \times E+10\Omega$ or less.
(5) Preferably, the specific constitutive material has a total amount of outgassing of 40 ppm or less in measuring by a headspace method under a condition at 150 degree C. for 60 minutes.
(6) Preferably, the specific constitutive material further comprises a polyethylene (D component) having a viscosity-average molecular weight of 1 million or more.
(7) Preferably, the specific constitutive material further comprises a particulate conductive filler (E component) having an n-dibutyl phthalate oil absorption of 180 mL/100 g or more.

Advantageous Effects of Invention

According to the present invention, a substrate storage container capable of keeping low a relative humidity for a long period of time even after purging can be provided.

DESCRIPTION OF EMBODIMENTS

Hereinafter, with reference to the attached drawings, an embodiment for carrying out the present invention (hereinafter, referred to as "embodiment") shall be described in detail.

Figure 1:
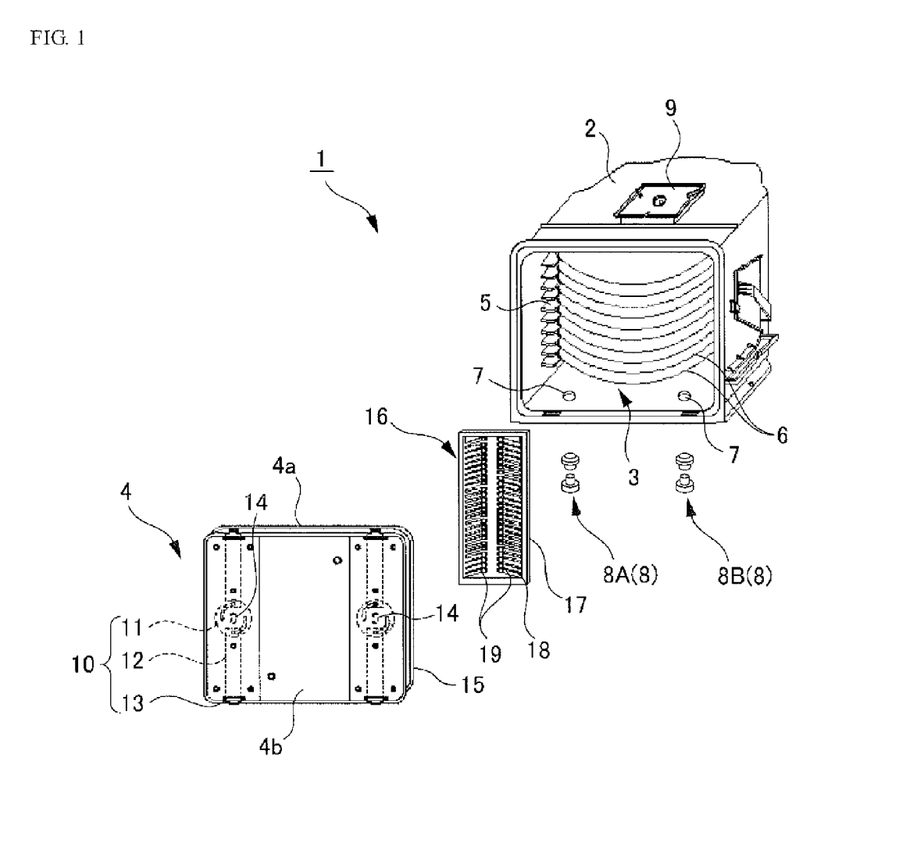
FIG. 1 is an exploded perspective view illustrating a substrate storage container (FOUP) according to an embodiment of the present invention.

As a substrate storage container which is an embodiment according to the present invention, an explanation shall be made on FOUP (Front Opening Unified Pod) as illustrated in FIG. 1 which is used as a container in the process in a semiconductor factory. A substrate storage container (FOUP) 1 includes a shell body 2 having an opening in front, and a door 4 forming an internal closed space 3 therein in cooperation with the shell body 2 which closes the opening of the shell body 2.

On the facing inner walls of the shell body 2, as illustrated in FIG. 1, plural sets of a pair of support member 5 are provided so as to face each other. The plural sets of a pair of support member 5 are disposed at regular intervals in the vertical direction, substrate 6 is supported in a horizontal state by a pair of support member 5 of each set.

Further, a through hole 7 is formed at 2 to 4 places in (a base of) the shell body 2. Two types of on-off valves 8A, SB for supplying and exhausting (8 is used as a representative code when the function is common) are mounted to the through hole 7. Using the on-off valves 8A, 8B, the gas in the internal closed space 3 can be substituted. Specifically, the on-off valve 8A (8B) includes, an upper cylindrical body which is attachable from the upper surface side of the through hole 7 of the shell body 2, an lower cylindrical body which is attachable from the lower surface side of the through hole 7 of the shell body 2, a valve body incorporated movably in the inside thereof while being supported by an elastic member, a filter, an O-ring for sealing disposed between these components, and the elastic member for moving the valve body. Usually, the internal closed space 3 of the substrate storage container 1 is kept in a sealed state, and when a purge port is connected, the internal closed space 3 of the substrate storage container 1 can be communicated with the outside (a purgeable state) by opening the valve body.

Further, on the top surface of the shell body 2, a robotic flange 9 for transportation is provided, and on the top surface of the shell body 2, an opening and closing apparatus (not illustrated) for performing opening and closing operations and a positioning means for positioning the substrate storage container 1 to a processing apparatus (not illustrated) which applies various types of processing to the substrate 6 are provided.

The door 4 is provided with a dish-shaped door body 4a and a cover plate 4b which is attached so as to close the opening of the door body 4a, and in the inside, a locking mechanism 10 for locking the door 4 to the shell body 2 is provided. The locking mechanism 10 is composed of a rotating member 11, a connecting bar 12 which is allowed to move in the longitudinal direction by the rotation of the rotating member 11. The cover plate 4b is provided with an operation hole 14 in a portion facing the rotating member 11, and the locking mechanism 10 can be operated through the operation hole 14. In addition, a gasket 15 is provided on the entire circumference of the side surface of the door body 4a. When the door 4 closes the opening of the shell body 2, the gasket 15 ensures the sealing performance of the shell body 2 with the peripheral edge portion of the opening.

Further, on the back surface of the door 4, as illustrated in FIG. 1, a retainer 16 is provided. The retainer 16 is configured by a frame body 17 of a rectangular shape, and an elastic piece 18 which is branched into a strip shape and protrudes to the side of the substrate 6. A holding groove 19 of a V or U shape cross-section which contacts with the substrate 2 is formed on the elastic piece 18.

In use of the substrate storage container 1, a substrate 6 (semiconductor wafer) is stored in the shell body 2, and upon completion of the storage, the opening of the shell body 2 is closed (sealed) by the door 4. Then, the substrate storage container 1 is introduced into the production process of semiconductor components. In each step of the production process, the substrate storage container 1 is docked to a port portion (load port) of a processing apparatus which is set in a clean environment, and then, the door 4 is opened and the substrate 6 is taken out through the opening from the inside of the shell body 2. Upon completion of the storage of the substrate 6, the opening of the shell body 2 is closed by the door 4, and the door 4 is locked. The substrate storage container 1 is transported to the next step by the transport apparatus, and the same operations are repeated in the followings. In this case, where necessary, by utilizing the on-off valves 8A, 8B which are provided on the substrate storage container 1, an inert gas is injected into the internal closed space 3 of the substrate storage container 1, and the gas in the internal closed space 3 is substituted.

In use of the substrate storage container 1, as described above, the shell body 2, the door 4, and the on-off valve 8 which form the substrate storage container 1 partition the internal closed space 3. The shell body 2, the door 4, the on-off valve 8, and the like have a specific configuration each as follows.

(Water Absorption)

For the shell body 2, the door 4, and the on-off valve 8 which are the constituting members for partitioning the internal closed space 3, a specific constitutive material which has water absorption of 0.1 wt. % or less having been measured after immersing in water at 23 degree C. for 24 hours is used. The purpose of this is to suppress significantly the release of water into the internal closed space 3 from the shell body 2, the door 4, and the on-off valve 8, based on the findings of the inventors of the present invention.

The specific constitutive material is specified by the water temperature, the immersing time, and the water absorption. The reason is to allow the objective judgment, under the criteria according to JIS K 7209 Standard and ISO 62 Standard.

The reason why the condition of the water absorption of 0.1 wt. % or less having been measured after immersing in water at 23 degree C. for 24 hours is used is as follows. If the water absorption which is measured after immersing in water at 23 degree C. for 24 hours exceeds 0.1 wt. %, realistic requirements cannot be satisfied objectively, with regard to the water release suppression ability, and the relative humidity in the internal closed space 3 cannot be kept low for a long period of time after purging.

(Humidity)

The internal closed space of the substrate storage container 1, based on a configuration of the shell body 2, the door 4, and the on-off valve 8 (the specific constitutive material), is set so that using a condition of a relative humidity of 0% in the internal closed space as a starting standard, the relative humidity therein at a time after having been let stand for 24 hours in nature remains at 10% or less. This is to meet the realistic demands in the production process of a semiconductor component, etc.

In this case, on the condition that the relative humidity in the internal closed space 3 is kept at 10% or less, all of the shell body 2, the door 4, the on-off valve 8, and the support member 5 and the retainer 16 which are configured in the internal closed space 3 may be the specific constitutive material. Some portion of the shell body 2, the door 4, the on-off valve 8, and the support member 5 and the retainer 16 which are configured in the internal closed space 3 may be the specific constitutive material. Of course, with increasing ratio of the specific constitutive material in the shell body 2, the door 4, the on-off valve 8, and the support member 5 and the retainer 16 which are configured in the internal closed space 3, the relative humidity in the internal closed space 3 can be kept low, and based thereon, the relative humidity in the internal closed space 3 can be adjusted appropriately at a predetermined value (for example, 5%) of 10% or less.

The condition is used as a standard that the internal closed space is set so that using a condition of a relative humidity of 0% in the internal closed space as a starting standard, the relative humidity therein at a time after having been let stand for 24 hours in nature remains at 10% or less. The reason is for use as an objective judgment criteria taking into consideration the realistic demands in the production process of a semiconductor component, etc. With the above configuration, the relative humidity of the internal closed space 3 can be kept low and it is possible to provide a substrate storage container 1 which meets the realistic demands.

(Material)

It is preferred that the shell body 2, the door 4, the on-off valve 8 which configure the substrate storage container 1 is formed (molded) by a thermoplastic resin such as a cyclic olefin resin, a liquid crystal polymer, a polyphenylene sulfide, a polypropylene, a polyether ether ketone, or the like. The reason is that these have low water absorption and high water release suppression capability, and by utilizing the properties, as described above, the relative humidity in the internal closed space 3 can be kept at 10% or less.

In this case, it is particularly preferable to use a cyclic olefin resin as the thermoplastic resin. That is because the cyclic olefin resin is superior in terms dimensional accuracy and formability, and cost. As the cyclic olefin resin, a ring-opened polymer of a monomer having a norbornene ring and a hydrogenated product thereof can be used, and a hydrogenated product of the ring-opening polymer is particularly preferred. In addition, in the case the glass transition temperature of the thermoplastic resin measured by a measuring method conforming to JIS K 7121 falls in a range of 101 to 160 degree C., it is possible to reduce the outgassing and to enhance the mechanical strength (strength in high temperature).

For example, ZEONEX (registered trademark) (made by ZEON CORPORATION), ZEONOR (registered trademark) (made by ZEON CORPORATION), and the like can be used. In addition, a copolymer or an alloy with other resin mainly of a cyclic olefin resin having a water absorption of 0.1 wt. % or less can be used. In addition, in the case the glass transition temperature thereof measured by a measuring method conforming to JIS K 7121 falls in a range of 101 to 160 degree C., it is possible to reduce the outgassing and to enhance the mechanical strength (strength in high temperature).

To 100 parts by mass of the cyclic olefin resin (A component), 3 to 25 parts by mass of a fibrous conductive filler (B component) and 5 to 25 parts by mass of a polyolefin based and/or a polystyrene-based thermoplastic elastomer (C component) as a shock improvement material can be added. With the above configuration, a resin which is preferable from the standpoint of the water absorption can be used and it also has an advantage as described below.

With regard to the shell body 2 and the support member 5, as the B component, in order to impart electrical conductivity, to 100 parts by mass of the thermoplastic resin described above, 3 to 25 parts by mass of a fibrous conductive material such as a carbon fiber, a carbon nanotube, a polymer fiber coated with a noble metal, metal fibers of a stainless steel or the like, a whisker, etc., can be added. As the fibrous conductive material, a conductive filler having an aspect ratio (length/width) of 3 or more is referred to, which is defined in the "Fibrous particle measurement method in the air" of JIS K 3850. In the case less than 3 parts by mass of the fibrous conductive material is added, sufficient electrical conductivity is hardly obtained, and in the case more than 25 parts by mass of the fibrous conductive material is added, a decrease of impact resistance is easily caused. In particular, 3 to 15 parts by mass is more preferable.

As the fibrous conductive material, in order to obtain a conductive performance in the surface resistance of 1.0×E+ 10Ω or less, polyacrylonitrile (PAN) based carbon fibers, and pitch based carbon fibers can be used. With regard to the fibrous conductive material having a fiber size of a long fiber, a short fiber (cut fiber), a middle fiber, and the like, by using an appropriate surface treatment agent (sizing agent) such as an epoxy based resin, an urethane based resin, etc., for example, further if necessary, it is also possible to modify the affinity and the adhesive properties with the resin interface. Especially, the fibrous conductive material having the fiber length of 3 to 6 mm and the fiber diameter of 5 to 15 μm is preferred. In addition, from the standpoint of the outgassing, it is preferred that the degree of impregnation of the sizing agent is 2 mass % or less. Properties of the material including the addition amount of the carbon fiber and the surface resistance are not uniquely specified by the characteristics of the carbon such as fiber length and the like as described above. As long as the mechanical properties, the moldability, the dimension, etc., of the material besides the surface resistance, are in a scope of the spirit of the present invention, the type and the addition amount of the material can be appropriately adjusted.

As the C component, a polyolefin-based thermoplastic elastomer and a polystyrene-based thermoplastic elastomer can be used alone or in combination thereof. By using the C component of 5 parts by mass or more, the impact resistance can be improved, and by using the C component of 25 parts by mass or less, a decrease of the strength in high temperature can be prevented. Further, 5 to 15 parts by mass is more preferable.

The polyolefin-based thermoplastic elastomer is ethylene and 1-butene random copolymers. The polyolefin-based thermoplastic elastomer is referred to as a polymeric material which is an elastic body at room temperature.

The polystyrene-based thermoplastic elastomer is made by block copolymerizing a polystyrene portion which is a hard segment and a portion composed of a polybutylene, a polyethylene, a butadiene, an isoprene, etc., which are a soft segment, and is referred to as a polymeric material which is an elastic body at room temperature. It is represented by an aromatic vinyl-conjugated diene block copolymer. A styrene-butadiene-styrene (SBS), a styrene-butadiene-butylene-styrene (SBBS), a styrene-ethylene-butylene-styrene (SEBS), etc., are mentioned for example.

Among the members constituting the substrate storage container 1, the shell body 2, the support member 5, and the on-off valve 8 in particular, can contain D component of an ultra high molecular weight polyethylene having a viscosity-average molecular weight of 1,000,000 or more, as a specific constitutive material. The content of 1 to 20 parts by mass to 100 parts by mass of A component is preferable, and 5 to 15 parts by mass is more preferable. In the case the content of the D component to 100 parts by mass of the A component is less than the preferable lower limit value, the slidability to the wafer, the appearance of the weld and the improvement effect of the strength are not sufficient, and the content of the D component to 100 parts by mass of the A component exceeds the preferable upper limit value, the flowability of the resin composition is impaired, and the surface appearance of the molded body tends to grow worse.

Further, 1 to 20 parts by mass of the content of the D component in the resin composition to 100 parts by mass of the sum of the A component+the B component+the C component is preferable, and 5 to 15 parts by mass is more preferable. In the case the content of the D component to 100 parts by mass of the sum of the A component+the B component+the C component is less than the preferable lower limit value, the slidability to the wafer, the appearance of the weld and the improvement effect of the strength are not sufficient, and the content of the D component to 100 parts by mass of the sum of the A component+the B component+the C component exceeds the preferable upper limit value, the flowability of the resin composition is impaired, and the surface appearance of the molded body tends to grow worse.

Using the intrinsic viscosity [η] measured in a decane solvent of 135 degree C., the viscosity-average molecular weight is calculated on the basis of the following formula.

$$[\eta]=kMv\alpha$$

Wherein, Mv is a viscosity-average molecular weight, and k and α are constants. In the case it is 1,000,000 or more, the wear resistance to the wafer and the weld adhesion can be improved, and in the case it is 4,000,000 or less, the good flowability during molding can be kept easily.

In this way, it is preferable to add 1 to 20 parts by mass of an ultra high molecular weight polyethylene to the materials of the support member 5, and/or the shell body 2, and the on-off valve 8 in particular among the members constituting the substrate storage container 1. It is because the slidability to the wafer is enhanced for the support member 5, and the outer appearance and the strength are enhanced for the shell body 2 and the on-off valve 8. The reason for setting the "1 to 20 parts by mass" is as follows. In the case it is less than 1 parts by mass, the desired slidability cannot be obtained, and in the case it is more than 20 parts by mass, the moldability is impaired.

The specific constitutive material of the door body 4a and door cover plate 4b in particular among the members constituting the substrate storage container 1 can contain the E component of a particulate conductive filler of 180 mL/100 g or more of the DBP oil absorption amount. The content of 1 to 15 parts by mass to 100 parts by mass of the A component is preferable and the content of 5 to 12 parts by mass is more preferable. In the case the content of the E component to 100 parts by mass of the A component is less than the lower limit value, the surface resistance of $1.0\times E+10\Omega$ or less is difficult to obtain stably in the door member plane, and a trouble occurs in the electrically conductive performance required in the substrate storage container 1, and the flatness of the door member also becomes difficult to obtain. When the door is closed, the fitness and the air tightness in the outer peripheral portion in contact with the shell body are impaired, and it becomes difficult to keep the humidity low in FOUP for a long time after purging. On the other hand, in the case it exceeds the preferable upper limit value, a decrease of the impact resistance tends to occur easily, and it may generate a source of contamination.

Further, 1 to 12 parts by mass of the content of the E component in the resin composition to 100 parts by mass of the sum of the A component+the B component+the C component is preferable, and 1 to 10 parts by mass is more preferable. In the case the content of the E component to 100 parts by mass of the sum of the A component+the B component+the C component is less than the preferable lower limit value, the surface resistance of $1.0\times E+10\Omega$ or less is difficult to obtain stably in the door member plane, and a trouble occurs in the electrically conductive performance required in the substrate storage container 1, and the flatness of the door member also becomes difficult to obtain. When the door is closed, the fitness and the air tightness in the outer peripheral portion in contact with the shell body are impaired, and it becomes difficult to keep the humidity low in FOUP for a long time after purging. On the other hand, in the case it exceeds the preferable upper limit value, a decrease of the impact resistance tends to occur easily, and it may generate a source of contamination.

Further, when using the E component, 5 to 25 parts by mass of the content of the sum of the B component and the E component in the resin composition to 100 parts by mass of the entire resin composition is preferable, and 5 to 18 parts by mass is more preferable. In the case the content of the sum of the B component and the E component is less than the preferable lower limit value, the desired electrically conductive performance is difficult to obtain, and in the case the content of the sum of the B component and the E component exceeds the preferable upper limit value, a decrease of the impact resistance tends to occur easily.

As the particulate conductive filler of the E component, various carbon blacks containing Ketchen black, a polymer micro particle coated with a metal, a metallic micro particle of electrically conductive titanium oxide, copper, copper alloy, silver, nickel, or low melting point alloy (solder or the like), a metal oxide micro particle of zinc oxide, tin oxide, indium oxide, or the like, a noble metal micro particle of copper or silver coated with a conductive polymer such as a polyaniline, etc., can be used.

Meanwhile, the necessary parts of the shell body 2, the support member 5, the positioning means, and the like may be integrally formed, or may be formed each as an individual component and then they may be assembled.

In the above each case, in order to obtain predetermined values of the electrical conductivity, the mechanical properties, the chemical cleanliness by the outgassing, etc., in accordance with the base thermoplastic resin, an appropriate surface treatment and the like can be selected in a range without departing from the object of the present invention.

The shell body 2, the door 4, the on-off valve 8, and the support member 5 constituting the substrate storage container 1, as the specific constitutive material, can contain 1 to 20 parts by mass preferably, and 5 to 15 parts by mass more preferably of the D component of the ultra high molecular weight polyethylene having a viscosity-average molecular weight of 1,000,000 or more, to 100 parts by mass of the total of the A component+the B component+the C component, and can contain 1 to 12 parts by mass preferably, and 1 to 10 parts by mass more preferably of the E component of the particulate conductive filler of 180 mL/100 g or more of the DBP oil absorption amount, to 100 parts by mass of the total of the A component+the B component+the C component.

With regard to the material of the shell body 2, the door 4, and the on-off valve 8 constituting the substrate storage container 1, the total amount of the outgassing as measured by the head space method under the condition at 150 degree C. for 60 minutes, is preferably 40 ppm or less. In the case the total amount of the outgassing as measured by the head space method under the condition at 150 degree C. for 20 minutes exceeds 40 ppm, the outgassing gives an adverse effect on the substrate 6, and the like. According to the above configuration, a material which is preferred from the standpoint of the outgassing can be used.

EXAMPLES

The above-mentioned contents are supported by the contents of TABs. 1 to 3 indicating the results of the following examples and comparative examples. TAB. 1 indicates examples 1 to 6, TAB. 2 indicates examples 7 to 13 and TAB. 3 indicates comparative examples 1 to 8, respectively.

TABLE 1

| Constituting material/Evaluation item | | | Part | Example 1 | Example 2 | Example 3 | Example 4 | Example 5 | Example 6 |
|---|---|---|---|---|---|---|---|---|---|
| | | | Shell body 2 | ◯ | ◯ | ◯ | ◯ | ◯ | ◯ |
| | | | On-off valve 8 | | | | | | |
| | | | Support member 5 | ◯ | ◯ | ◯ | ◯ | ◯ | ◯ |
| | | | Door 4 (Body 4a, Cover 4b) | | | | | | |
| Base resin | (A) Cyclic olefin | (A1) component | Mass part | 100 | 100 | | 100 | 100 | 100 |
| | Polycarbonate | (A2) component | | | | 100 | | | |
| Addition filler | (B) Carbon fiber | | | 6 | 13 | 13 | 13 | 13 | 13 |
| | (C) Impact improvement material | (C2) component Polystyrene-based elastomer | | | | | 5 | 13 | 24 |
| | | (C1) component Polyolefin-based elastomer Polyester-based elastomer | | 12 | 13 | 13 | | | |
| | (D) Ultra high molecular weight PE | Ratio of D component to 100 parts by mass of A component | | | | | | | |
| | | Ratio of D component to 100 parts by mass of total of A, B, C components | | | | | | | |
| | (E) Ketchen black | Ratio of E component to 100 parts by mass of A component | | | | | | | |
| | | Ratio of E component to 100 parts by mass of total of A, B, C components | | | | | | | |
| Plate Evaluation item | Water absorption | | % | 0.01 | 0.02 | 0.01 | 0.01 | 0.01 | 0.02 |
| | Bending strength | | MPa | 85 | 97 | 85 | 105 | 100 | 80 |
| | Charpy impact strength | | kJ/m$^2$ | 5.0 | 6.0 | 9.7 | 4.0 | 5.2 | 8.6 |
| | Surface resistance | | Ω | 9.3E+08 | 1.3E+06 | 2.20E+06 | 2.60E+06 | 2.40E+06 | 3.10E+06 |
| | Standard deviation of Surface resistance | | | 0.05 | 0.04 | 0.04 | 0.04 | 0.04 | 0.03 |
| | Outgassing | | ppm | 20 | 22 | 24 | 14 | 20 | 30 |
| FOUP Evaluation item | Humidity in FOUP after 24 hours purging | | % RH | 2.7 | 2.4 | 3.3 | 2.2 | 3.6 | 4.1 |
| | Withstand voltage decay | | second | 0.1 | 0.1 | 0.1 | 0.1 | 0.1 | 0.2 |
| | Organic materials attached to wafer | | ng/cm$^2$ | 1.2 | 1.7 | 2.1 | 1.3 | 1.8 | 2.7 |
| | Wafer tensile load | | N | 1.2 | 1.1 | 0.9 | 1.1 | 0.9 | 0.8 |
| | Weld portion appearance | | | ◯ | ◯ | ◯ | ◯ | ◯ | ◯ |

TABLE 2

| Constituting material/Evaluation item | | Part | Example 7 | Example 8 | Example 9 | Example 10 | Example 11 | Example 12 | Example 13 |
|---|---|---|---|---|---|---|---|---|---|
| | | Shell body 2 | ◯ | ◯ | ◯ | Example 2 | Example 2 | Example 2 | Example 2 |
| | | On-off valve 8 | | | | | | | |
| | | Support member 5 | ◯ | ◯ | ◯ | Example 2 | Example 2 | Example 2 | |

TABLE 2-continued

| Constituting material/Evaluation item | | | Part | Example 7 | Example 8 | Example 9 | Example 10 | Example 11 | Example 12 | Example 13 |
|---|---|---|---|---|---|---|---|---|---|---|
| | | | Door 4 (Body 4a, Cover 4b) | Example 2 | Example 2 | Example 2 | | | | |
| Base resin | (A) Cyclic olefin | (A1) component | Mass part | 100 | 100 | 100 | 100 | 100 | 100 | 100 |
| | | (A2) component Polycarbonate | | | | | | | | |
| Addition filler | (B) Carbon fiber | | | 13 | 13 | 13 | 13 | 13 | 13 | 14 |
| | (C) Impact improvement material | (C2) component Polystyrene-based elastomer | | | | | | | | |
| | | (C1) component Polyolefin-based elastomer | | 13 | 13 | 13 | 13 | 13 | 13 | 14 |
| | | Polyester-based elastomer | | | | | | | | |
| | (D) Ultra high molecular weight PE | Ratio of D component to 100 parts by mass of A component | | 2 | 7 | 18 | | | | 7 |
| | | Ratio of D component to 100 parts by mass of total of A, B, C components | | 1.6 | 5.6 | 14.3 | | | | 5.5 |
| | (E) Ketchen black | Ratio of E component to 100 parts by mass of A component | | | | | 2 | 7 | 9 | 7 |
| | | Ratio of E component to 100 parts by mass of total of A, B, C components | | | | | 1.6 | 5.6 | 7.1 | 5.5 |
| Plate Evaluation item | Water absorption | | % | 0.01 | 0.01 | 0.01 | 0.01 | 0.01 | 0.01 | 0.01 |
| | Bending strength | | MPa | 98 | 95 | 90 | 98 | 95 | 88 | 95 |
| | Charpy impact strength | | kJ/m$^2$ | 5.7 | 5.4 | 6.0 | 5.5 | 5.2 | 4.4 | 4.8 |
| | Surface resistance | | Ω | 4.70E+06 | 5.20E+06 | 6.10E+06 | 4.50E+05 | 3.70E+05 | 2.10E+05 | 7.30E+05 |
| | Standard deviation of Surface resistance | | | 0.03 | 0.04 | 0.04 | 0.02 | 0.042 | 0.01 | 0.01 |
| | Outgassing | | ppm | 19 | 23 | 30 | 21 | 24 | 28 | 25 |
| FOUP Evaluation item | Humidity in FOUP after 24 hours purging | | % RH | 2.9 | 3.3 | 3.0 | 1.7 | 1.6 | 1.4 | 1.4 |
| | Withstand voltage decay | | second | 0.1 | 0.1 | 0.2 | 0.1 | 0.1 | 0.1 | 0.1 |
| | Organic materials attached to wafer | | ng/cm$^2$ | 1.7 | 2.1 | 2.7 | 1.7 | 1.9 | 2.2 | 2.7 |
| | Wafer tensile load | | N | 0.7 | 0.7 | 0.5 | 0.9 | 0.9 | 0.8 | 0.6 |
| | Weld portion appearance | | | ◎ | ◎ | ◎ | ○ | ○ | ○ | ◎ |

TABLE 3

| Constituting material/Evaluation item | Part | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| | Shell body 2 On-off valve 8 | ○ | ○ | ○ | ○ | ○ | ○ | ○ | ○ |
| | Support member 5 | ○ | ○ | ○ | ○ | ○ | ○ | ○ | ○ |
| | Door 4 (Body 4a, Cover 4b) | ○ | ○ | ○ | ○ | ○ | ○ | ○ | ○ |

TABLE 3-continued

| Constituting material/Evaluation item | | | Part | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|---|
| Base resin | (A) Cyclic olefin | (A1) component | Mass part | | 100 | 100 | 100 | 100 | 100 | 100 | 100 |
| | | (A2) component | | | | | | | | | |
| | Polycarbonate | | | 100 | | | | | | | |
| Addition filler | (B) Carbon fiber | | | | 6 | 11 | 2 | 29 | 14 | 13 | 3 | 13 |
| | (C) Impact improvement material | (C2) component Polystyrene-based elastomer | | | 12 | | | | | | | |
| | | (C1) component Polyolefin-based elastomer | | | | | 11 | 14 | 29 | | 13 | 3 |
| | | Polyester-based elastomer | | | | | | | | | 13 | |
| | (D) Ultra high molecular weight PE | Ratio of D component to 100 parts by mass of A component | | | | | | | | | 25 | |
| | | Ratio of D component to 100 parts by mass of total of A, B, C components | | | | | | | | | 22 | |
| | (E) Ketchen black | Ratio of E component to 100 parts by mass of A component | | | | | | | | | | 14 |
| | | Ratio of E component to 100 parts by mass of total of A, B, C components | | | | | | | | | | 12 |
| Plate Evaluation Item | Water absorption | | % | 0.19 | 0.01 | 0.02 | 0.01 | 0.01 | 0.01 | 0.01 | 0.01 |
| | Bending strength | | MPa | 140 | 100 | 85 | 105 | 77 | 82 | 79 | 80 |
| | Charpy impact strength | | kJ/m$^2$ | 6.0 | 1.0 | 6.8 | 2.8 | 9.8 | 2.5 | 4.5 | 2.5 |
| | Surface resistance | | Ω | 8.7E+08 | 4.7E+06 | 1.0E+14 | 2.3E+02 | 5.5E+06 | 1.8E+06 | 2.5E+10 | 7.8E+04 |
| | Standard deviation of Surface resistance | | | 0.05 | 0.04 | — | 0.02 | 0.05 | 0.04 | 0.05 | 0.04 |
| | Outgassing | | ppm | 10 | 12 | 17 | 26 | 42 | 45 | 44 | 35.0 |
| FOUP Evaluation item | Humidity in FOUP after 24 hours purging | | % RH | 23.0 | | | | 2.8 | | | |
| | Withstand voltage decay | | second | 0.1 | | | | 0.1 | | | |
| | Organic materials attached to wafer | | ng/cm$^2$ | 1.4 | | | | 5.3 | | | |
| | Wafer tensile load | | N | 1.3 | | | | 1.2 | | | |
| | Weld portion appearance | | | ○ | | | | ○ | | | |

Example 1

As a material for the shell body 2, the on-off valve 8, the support member 5, and the door body 4a and the door cover plate 4b (hereinafter, door 4), a mixture of 100 parts by mass of A1 component of a cyclic olefin resin (trade name: ZEONOR (registered trademark) 1420R, made by ZEON CORPORATION), 6 parts by mass of B component of a particulate electrically conductive filler (trade name; EPU-LCL, made by NIPPON POLYMER CO., LTD.), and 12 parts by mass of C1 component of a polyolefin-based elastomer (trade name: Tafmer A 4085S (Tamfer is a registered trademark), made by Mitsui Chemicals) were kneaded by a twin screw extruder and a resin composition in pellet form for injection molding was obtained. By injection molding this, a dumbbell test piece for strength measurement (multipurpose test specimen A of ISO standard) and a flat plate of 75 mm square for conductive performance measurement were formed using a conventional method each, and a test piece for each testing was prepared. Further, in another example, A2 component of another cyclic olefin resin (trade name; ZEONOR (registered trademark) 1020R, made by ZEON CORPORATION) can be used instead of the A1 component. Further, C2 component of a polystyrene-based elastomer resin can be used instead of the C1 component. Further, D component and E component can be added in an appropriate amount if necessary. For example, as the C2 component, a product called TUFTEC (registered trademark) H1053 (trade name, made by Asahi Kasei Corporation) can be used, and as the D component, a product called Miperon (registered trademark) XM-220 (trade name, made by MITSUI CHEMICALS, INC) can be used, and as the E component, a product called Ketchen black (registered trademark) EC300J (trade name, made by Lion Corporation) can be used.

(Measurement of Water Absorption)

The injection molded plate was immersed in water at 23 degree C. for 24 hours and was taken out and then the mass increment rate was measured in conformance to the regulation of JIS K 7209 standard or ISO 62 standard, and a measurement value of 0.01% was obtained.

As an indicator of the mechanical strength, the bending strength and the Charpy impact strength were measured under each method described below.

(Bending Strength)

The bending strength was measured by a method in conformance to the regulation of ISO 178/A/2. While the acceptable strength is more than 80 MPa, the measurement strength was 85 MPa.

(Charpy Impact Strength)

The Charpy impact strength was measured by a method in conformance to the regulation of ISO 179-1eA. While the acceptable Charpy impact strength is more than 3.0 $kJ/m^2$, the measurement strength was 5.0 $kJ/m^2$.

(Surface Resistance Measurement)

As an indicator of the electrically conductive performance, in conformance to the regulation of ASTM D256, the surface resistance was measured for each part of a test plate divided into 6 parts, and an average value and a standard deviation were calculated. While the acceptable average value of the surface resistance is $1.0 \times E+10 \Omega$ or less, the measurement value was $9.3 \times E+8 \Omega$.

(Outgassing Measurement)

From the same plate, about 0.1 g was sampled, and this was heated at 150 degree C. for 60 minutes under helium atmosphere. Once the outgas component generated from the sample during this period was collected in a trap tube cooled by liquid nitrogen, and then heating this, using a gas chromatograph (GC-MS) connected to a mass spectrometer, all the collected outgassing component was quantified by a calibration curve with a standard material of n-decane (dynamic head space method). As a result, the amount of outgassing was 20 ppm.

(Preparation of Container for 300 mm Wafer in Process (Substrate Storage Container 1 (FOUP)))

As illustrated in FIG. 1, a shell body 2 provided with 25 pieces of support member (teeth) 5 each which support a substrate (wafer) 6 at both the ends, on both the facing left and right side wall portions in the shell body 2, a supply side on-off valve 8A and an exhaust side on-off valve 8B (hereinafter, on-off valve 8) for purging the gas in an internal closed space 3 within a substrate storage container 1, on the bottom portion, and a kinematic coupling 20 for positioning various apparatus, was obtained by injection molding using the above material composed of a cyclic olefin polymer, a carbon fiber and a polyolefin-based elastomer.

On the other hand, by injection molding using the same material, a door body 4a for disposing on an opening portion of the shell body 2 and sealing thereof was obtained. In the inside of the door body 4a, a retainer 16 as a component for supporting the substrate 6 stored in the shell body 2 from the side surface in the door direction, was formed by injection molding using a polyether ether ketone resin (made by Victrex Japan Ltd.) and was installed so as to fit. A gasket 15 made of a fluorinated rubber for sealing the inside of the substrate storage container 1 was mounted on the outer peripheral portion of the door body 4a so as to contact therewith along the fitting portion when the door body 4a was closed to the shell body 2. Further, on the outside portion of the door 4, a series of parts that form a latch system for fitting and sealing mechanically when the door body 4a was closed to the shell body 2, were molded using the same polyether ether ketone resin and was installed.

Here, in the plates of the 75 mm×3 mm in size obtained by injection molding using the same resin, the water absorption was 0.07%, the surface resistance was $1.0 \times E+16 \Omega$, and the amount of the outgassing was 1.5 ppm, for the polyether ether ketone resin used herein, where each measurement was made by the method described above.

(Humidity Measurement in Substrate Storage Container 1 at 24 Hours Passage after Purging)

The shell body 2 and the door body 4a obtained as above were prepared respectively. The data logger TR-77Ui (made by T & D Corporation) which is commercially available was installed at the bottom portion of the shell body 2, and the door 4 was closed using a latching mechanism disposed to the door body 4a. In a clean room which is adjusted at a temperature of 23 degree C. and a humidity of 45%, with introducing dry nitrogen having a dew point of −50 degree C. from the purging port portion of the supply side disposed to the bottom portion of the shell body 2, the shell body 2 was exhausted from the purging port portion of the exhaust side, and the air in the internal closed space 3 of the substrate storage container 1 was substituted with the dry nitrogen. After confirming that the relative humidity of the humidity meter reached 0%, the introduction of the dry nitrogen was stopped, and the purging ports at the two positions were closed. After that, the relative humidity in the internal closed space 3 of the substrate storage container 1 was measure up to a time of 24 hours passage. As a result, the relative humidity was 2.7% at 24 hours passage, and the relative humidity of 10% or less which was a measure of practical use could be kept.

(Withstand Voltage Decay)

Figure 2:
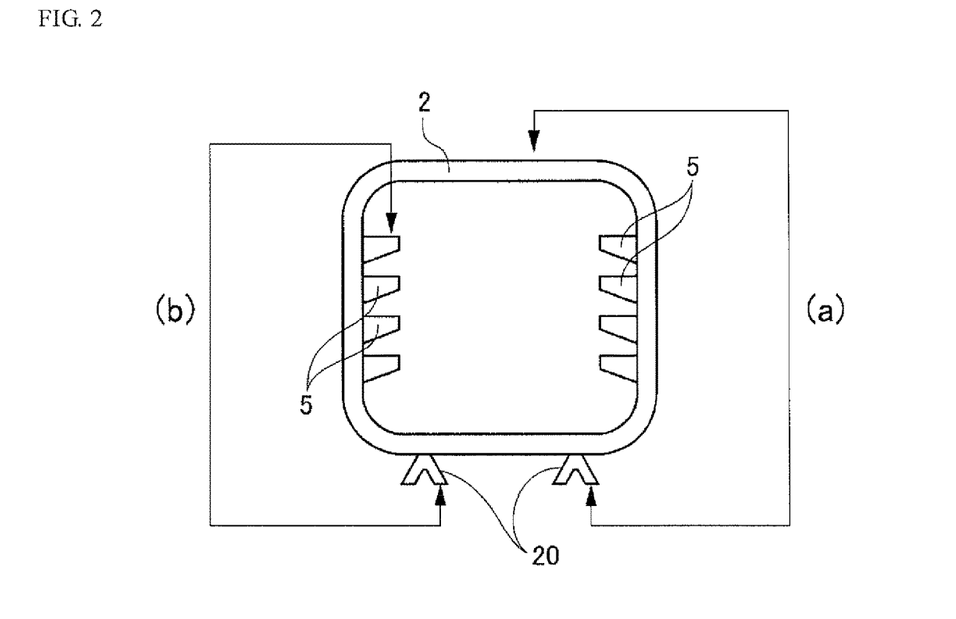
FIG. 2 is a schematic diagram illustrating the measurement of the withstand voltage decay of the substrate storage container (FOUP).

The shell body 2 obtained as above was prepared. As illustrated in FIG. 2, a time to decay to 10 V after applying a voltage of 1000 V in the following two aspects. One is aspect (a) where the kinematic couplings 20 on the top surface and the bottom surface of the shell body 2 are connected by the measurement terminals of a charged plate monitor CPM210 (made by ION Systems Inc. and Harada Corporation). The other is aspect (b) where the teeth 5 of the top of the shell body 2 and the kinematic couplings 20 are connected by the measurement terminals of the charged plate monitor CPM210. As a result, in both the aspects of (a) and (b), the decay time was 0.1 second less than 1 second which was a measure of practical use.

(Evaluation of Organic Materials Attached to Substrate (Wafer))

The shell body 2 and the door body 4a obtained as above were prepared respectively. A piece of a 300 mm-dia silicon wafer sheet was applied a preprocessing before heat treatment at 400 degree C. for 3 hours under He atmosphere, using the Silicon Wafer Analyzer (SWA, made by GL Sciences) to which the commercially available Gas chromatography/Mass spectrum (GC-MS) and an exclusive cell for a substrate. Then, the silicon wafer sheet was placed in the central teeth portion of the shell body 2, and the door was closed. Then, it was allowed to stand for 7 days in a clean room which was adjusted to a temperature of 23 degree C. and a humidity of 45%. After that, the wafer was taken out and the was heated to 400 degree C. under the He atmosphere in the SWA.

Then, the organic materials desorbed from the wafer were collected, and were analyzed using the SWA. All the organic materials were quantified using a calibration curve with the standard material of n-decane. As a result, the amount of organic materials per unit area was 1.2 $ng/cm^2$ less than 4 $ng/cm^2$ which was a measure of practical use.

(Slidability of Substrate)

Figure 3:
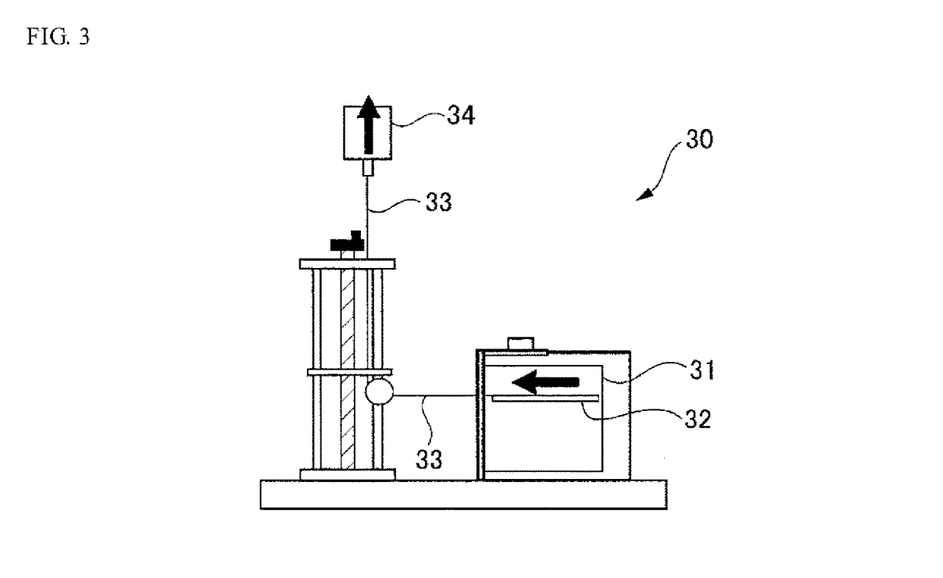
FIG. 3 is a schematic diagram illustrating the measurement of the sliding properties of the substrate storage container (FOUP).

The shell body 2 with a sample was set to the measurement device 30 as illustrated in FIG. 3. A silicon wafer 32 was loaded to an arbitrary support portion 32 selected in advance, and a fishing line 33 and the silicon wafer 32 were fixed with a tape. After confirming that the fishing line 33 is perpendicular and horizontal to the silicon wafer 32, a tensile load of the silicon wafer 32 was measured using a Tensilon measuring machine 34. As a result, the tensile load was 1.2 N less than 2.0 N which was a measure of practical use.

Example 2

A test piece was molded using the pellet for injection molding in the same manner as in Example 1 except for the compositions changed to those in TAB. 1. The water absorption, the bending strength, the Charpy impact strength, the surface resistance and the amount of outgassing evaluated for the test piece were, 0.02%, 97 MPa, 6.0 $kJ/m^2$, 1.3×E+6Ω, and 22 ppm, respectively. Further, a substrate storage container 1 was molded and assembled using the pellet composed of the resin composition in the same manner as in Example 1 except for the compositions changed to those in TAB. 1. After purging the substrate storage container 1 for 24 hours, the relative humidity, the withstand voltage decay, the amount of organic materials attached to the wafer and the tensile load of the wafer for the substrate storage container 1, were 2.4%, 0.1 seconds, 1.7 $ng/cm^2$, and 1.1 N, respectively. Each value was in a practical use range.

Example 3

A test piece was molded using the pellet for injection molding in the same manner as in Example 1 except for the compositions changed to those in TAB. 1. The water absorption, the bending strength, the Charpy impact strength, the surface resistance and the amount of outgassing evaluated for the test piece were, 0.01%, 85 MPa, 9.7 $kJ/m^2$, 2.2×E+6Ω, and 24 ppm, respectively. Further, a substrate storage container 1 was molded and assembled using the pellet composed of the resin composition in the same manner as in Example 1 except for the compositions changed to those in TAB. 1. After purging the substrate storage container 1 for 24 hours, the relative humidity, the withstand voltage decay, the amount of organic materials attached to the wafer and the tensile load of the wafer for the substrate storage container 1, were 3.3%, 0.1 seconds, 2.1 $ng/cm^2$, and 0.9 N, respectively. Each value was in a practical use range.

Example 4

A test piece was molded using the pellet for injection molding in the same manner as in Example 1 except for the compositions changed to those in TAB. 1. The water absorption, the bending strength, the Charpy impact strength, the surface resistance and the amount of outgassing evaluated for the test piece were, 0.01%, 105 MPa, 4.0 $kJ/m^2$, 2.6×E+6Ω, and 14 ppm, respectively. Further, a substrate storage container 1 was molded and assembled using the pellet composed of the resin composition in the same manner as in Example 1 except for the compositions changed to those in TAB. 1. After purging the substrate storage container 1 for 24 hours, the relative humidity, the withstand voltage decay, the amount of organic materials attached to the wafer and the tensile load of the wafer for the substrate storage container 1, were 2.2%, 0.1 seconds, 1.3 $ng/cm^2$, and 1.1 N, respectively. Each value was in a practical use range.

Example 5

A test piece was molded using the pellet for injection molding in the same manner as in Example 1 except for the compositions changed to those in TAB. 1. The water absorption, the bending strength, the Charpy impact strength, the surface resistance and the amount of outgassing evaluated for the test piece were, 0.01%, 100 MPa, 5.2 $kJ/m^2$, 2.4×E+6Ω, and 20 ppm, respectively. Further, a substrate storage container 1 was molded and assembled using the pellet composed of the resin composition in the same manner as in Example 1 except for the compositions changed to those in TAB. 1. After purging the substrate storage container 1 for 24 hours, the relative humidity, the withstand voltage decay, the amount of organic materials attached to the wafer and the tensile load of the wafer for the substrate storage container 1, were 3.6%, 0.1 seconds, 1.8 $ng/cm^2$, and 0.9 N, respectively. Each value was in a practical use range.

Example 6

A test piece was molded using the pellet for injection molding in the same manner as in Example 1 except for the compositions changed to those in TAB. 1. The water absorption, the bending strength, the Charpy impact strength, the surface resistance and the amount of outgassing evaluated for the test piece were, 0.02%, 80 MPa, 8.6 kJ/m$^2$, 3.1×E+ 6Ω, and 30 ppm, respectively. Further, a substrate storage container 1 was molded and assembled using the pellet composed of the resin composition in the same manner as in Example 1 except for the compositions changed to those in TAB. 1. After purging the substrate storage container 1 for 24 hours, the relative humidity, the withstand voltage decay, the amount of organic materials attached to the wafer and the tensile load of the wafer for the substrate storage container 1, were 4.1%, 0.2 seconds, 2.7 ng/cm$^2$, and 0.8 N, respectively. Each value was in a practical use range.

Example 7

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 98 MPa, 5.7 kJ/m$^2$, 4.7×E+ 6Ω, and 19 ppm, respectively. Further, a substrate storage container 1 was molded and assembled using the pellet composed of the resin composition in the same manner as in Example 1 except for the compositions changed to those in TAB. 2. After purging the substrate storage container 1 for 24 hours, the relative humidity, the withstand voltage decay, the amount of organic materials attached to the wafer and the tensile load of the wafer for the substrate storage container 1, were 2.9%, 0.1 seconds, 1.7 ng/cm$^2$, and 0.7 N, respectively. Each value was in a practical use range.

Example 8

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 95 MPa, 5.4 kJ/m$^2$, 5.2×E+ 6Ω, and 23 ppm, respectively. Further, a support member 5 and a shell body 2 were molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the water for the substrate storage container 1, were 3.3%, 0.1 seconds, 2.1 ng/cm2, and 0.7 N, respectively. In particular, the slidability of the wafer became good and improvement was observed in the appearance of the weld portion which occurred on the back surface portion of the shell body 2.

Example 9

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 90 MPa, 5.0 kJ/m$^2$, 6.1×E+ 6Ω, and 30 ppm, respectively. Further, a support member 5 and a shell body 2 were molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the wafer for the substrate storage container 1, were 3.0%, 0.2 seconds, 2.7 ng/cm$^2$, and 0.5 N, respectively. In particular, the slidability of the wafer became good and improvement was observed in the appearance of the weld portion which occurred on the back surface portion of the shell body 2.

Example 10

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 98 MPa, 5.5 kJ/m$^2$, 4.5×E+ 5Ω, and 21 ppm, respectively. Further, a support member 5 and a shell body 2 were molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the wafer for the substrate storage container 1, were 1.7%, 0.1 seconds, 1.7 ng/cm$^2$, and 0.9 N, respectively. In particular, while the stability was improved without depending on the part due to the small standard deviation of the surface resistance, the slidability of the wafer became good. Further, improvement was observed in the appearance of the weld portion which occurred on the back surface portion of the shell body 2.

Example 11

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 95 MPa, 5.2 kJ/m$^2$, 3.7×E+ 5Ω, and 24 ppm, respectively. Further, a door 4 was molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the wafer for the substrate storage container 1, were 1.6%, 0.1 seconds, 1.9 ng/cm$^2$, and 0.9 N, respectively. In particular, while the stability was improved without depending on the part due to the small standard deviation of the surface resistance, the flatness of the door body 4a was improved, and improvement was observed in the retention of the relative humidity at 24 hours passage after purging.

Example 12

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 88 MPa, 4.4 kJ/m$^2$, 2.1×E+5 n, and 28 ppm, respectively. Further, a door 4 was molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the wafer for the substrate storage container 1, were 1.4%, 0.1 seconds, 2.2 ng/cm$^2$, and 0.8 N, respectively. In particular, while the stability was improved without depending on the part due to the small standard deviation of the surface resistance, the flatness of the door body 4a was improved, and improvement was observed in the retention of the relative humidity at 24 hours passage after purging and in the appearance of the weld portion which occurred on the back surface portion of the shell body 2, respectively.

Example 13

A test piece was molded using the pellet for injection molding in the same manner as in Example 1 except for the compositions changed to those in TAB. 2. The water absorption, the bending strength, the Charpy impact strength, the surface resistance and the amount of outgassing evaluated for the test piece were, 0.01%, 95 MPa, 4.8 kJ/m$^2$, 7.3×E+5Ω, and 25 ppm, respectively. Further, a support member 5 and a door 4 were molded using the pellet composed of the resin composition in the same manner as in Example 1 except for the compositions changed to those in TAB. 2, and the other parts were molded using the pellet composed of the resin composition of Example 2. A substrate storage container 1 was assembled from the above molded parts. After purging the substrate storage container 1 for 24 hours, the relative humidity, the withstand voltage decay, the amount of organic materials attached to the wafer and the tensile load of the wafer for the substrate storage container 1, were 1.4%, 0.1 seconds, 2.7 ng/cm$^2$, and 0.6 N, respectively. In particular, while the stability was improved without depending on the part due to the small standard deviation of the surface resistance, the flatness of the door body 4a was improved, and improvement was observed in the retention of the relative humidity at 24 hours passage after purging and in the appearance of the weld portion which occurred on the back surface portion of the shell body 2, respectively.

Comparative Example 1

A test piece was molded using the pellet for injection molding in the same manner as in Example 1 except for the compositions changed to those in TABLE 3. The water absorption, the bending strength, the Charpy impact strength, the surface resistance and the amount of outgassing evaluated for the test piece were, 0.19%, 140 MPa, 6.0 kJ/m$^2$, 8.7×E+8Ω, and 10 ppm, respectively. Further, a substrate storage container 1 was molded and assembled using the pellet composed of the resin composition in the same manner as in Example 1 except for the compositions changed to those in TAB. 3. The withstand voltage decay, the amount of organic materials attached to the wafer and the tensile load of the wafer for the substrate storage container 1, were 0.1 seconds, 1.4 ng/cm$^2$, and 1.3 N, respectively. However, the relative humidity after purging the substrate storage container 1 for 24 hours was 23.0%, and the relative humidity of 10% or less which was a measure of practical use could not maintained.

Comparative Example 2

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 100 MPa, 1.0 kJ/m$^2$, 4.7×E+6Ω, and 12 ppm, respectively. Because the Charpy impact strength was extremely low, and the Charpy impact strength of any part did not reach 3.0 kJ/m$^2$ which was a measure of practical use, evaluation as a substrate storage container was not performed.

Comparative Example 3

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.02%, 85 MPa, 6.8 kJ/m$^2$, 1.0×E+14Ω, and 17 ppm, respectively. Because the surface resistance less than 1.0×E+10Ω was not obtained, evaluation as a substrate storage container was not performed.

Comparative Example 4

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 105 MPa, 2.8 kJ/m$^2$, 2.3×E+2Ω, and 26 ppm, respectively. Because the Charpy impact strength for each of the parts which constitute the substrate storage container did not reach 3.0 kJ/m$^2$ which was a measure of practical use, evaluation as a substrate storage container was not performed.

Comparative Example 5

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 77 MPa, 9.8 kJ/m$^2$, 5.5×E+6Ω, and 42 ppm, respectively. Further, a substrate storage container 1 was molded and assembled using the pellet composed of the resin composition in the same manner as in Example 1 except for the compositions changed to those in TAB. 3. The withstand voltage decay, the amount of organic materials attached to the wafer and the tensile load of the wafer for the substrate storage container 1, were 2.8%, 0.1 seconds, 5.3 ng/cm$^2$, and 1.2 N, respectively. As a result, the amount of organic materials attached to the wafer which seemed to be due to the outgassing from the resin composition exceeded 4 ng/cm² which was a measure of practical use.

Comparative Example 6

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 82 MPa, 2.5 kJ/m², 1.8×E+6Ω, and 45 ppm, respectively. Because the Charpy impact strength for each of the parts which constitute the substrate storage container did not reach 3.0 kJ/m² which was a measure of practical use, evaluation as a substrate storage container was not performed.

Comparative Example 7

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 79 MPa, 4.5 kJ/m², 2.5×E+10Ω, and 44 ppm, respectively. Because the surface resistance of 1.0×E+10Ω or less was not obtained, and the molding was difficult, evaluation as a substrate storage container was not performed.

Comparative Example 8

A test piece was molded using the pellet for injection molding in the same manner as in Example 1 except for the compositions changed to those in TAB. 3. The water absorption, the bending strength, the Charpy impact strength, the surface resistance and the amount of outgassing evaluated for the test piece were, 0.01%, 80 MPa, 2.5 kJ/m², 7.8×E+4Ω, and 35 ppm, respectively. Because the Charpy impact strength for each of the parts which constitute the substrate storage container did not reach 3.0 kJ/m² which was a measure of practical use, evaluation as a substrate storage container was not performed.

As described above, by using a specific constitutive material having a water absorption of 0.1 wt. % or less measured after immersing thereof in water at 23 degree C. for 24 hours as the shell body 2, the door 3, and the on-off valve (constitutive materials for partitioning at least the internal closed space 3), the relative humidity in the internal closed space 3 of the substrate storage container 1 can be kept for a long period of time as it is, at the low humidity which was lowered by substituting (purging) with dry nitrogen and the like. Further, by using a specific constitutive material having a surface resistance of 1.0×E+10Ω or less, and a total amount of outgassing of 40 ppm or less measured by a head space method under a condition of 150 degree C. for 60 minutes, Electrostatic Discharge Damage and contamination by organic materials of a substrate 6 installed in the internal closed space 3 of the substrate storage container 1 can be prevented.

Further, by adding 1 to 20 parts by mass of ultra-high molecular weight polyethylene powder to the materials of the specific constitutive material (100 parts by mass of the total of the A component+the B component+the C component), the risk of generating trouble at the time of putting in and out the substrate can be reduced, and so, it is expected that the reliability and the yield of the devices to be manufactured from the substrate 6 installed in the substrate storage container 1 are significantly improved.

It is expected that in addition to the viewpoint of the surface resistance, the slidability and the weld strength are improved, by adding 1 to 15 parts by mass, preferably 1 to 12 parts by mass of a particulate electrically conductive filler having an oil absorption amount of 180 mL/100 g or more to the materials of the specific constitutive material (100 parts by mass of the total of the A component+the B component+the C component).

In the above description, the present invention has been described with reference to the embodiment, but it is needless to say that the technical scope of the present invention is not limited to the scope described in the above embodiment. It is apparent to those skilled in the art that various changes and modifications can be added to the above embodiment. It is apparent from the description of the appended claims that the embodiment added with such changes or modifications is included in the technical scope of the present invention.

REFERENCE SIGNS LIST

1 . . . substrate storage container; 2 . . . shell body; 3 . . . internal closed space; 4 . . . door; 5 . . . support member; 6 . . . substrate; 8, 8A, 8B . . . on-off valve; 16 . . . retainer; 30 . . . measurement device; 31 . . . support member; 32 . . . silicon wafer; 33 . . . fishing line

The invention claimed is:
1. A substrate storage container for storing a substrate in an internal closed space thereof, comprising a constitutive material defining the internal closed space, the constitutive material being formed of a specific constitutive material having a water absorption of 0.1 wt. % or less when immersed in water at 23 degree C. for 24 hours,
wherein the specific constitutive material comprises: a single cyclic olefin resin (A component) of 100 parts by mass; a carbon fiber (B component) of 6 to 14 parts by mass to the A component of 100 parts by mass; and a single polyolefin-based thermoplastic elastomer as an impact resistance improver (C component) of 12 to 14 parts by mass to the A component of 100 parts by mass or a single polystyrene-based thermoplastic elastomer product as an impact resistance improver (C component) of 5 to 24 parts by mass to the A component of 100 parts by mass,
the polyolefin-based thermoplastic elastomer product is ethylene and 1-butene random copolymers,
the polystyrene-based thermoplastic elastomer product is made by block copolymerizing a polystyrene portion with a hard segment and a soft segment which is composed of polybutylene, polyethylene, butadiene, or isoprene,
the specific constitutive material further comprises a polyethylene (D component) having a viscosity-average molecular weight of 1 million or more,
the D component is 1 to 15 parts by mass to 100 parts by mass of the sum of the A component, the B component, and the C component, and
the specific constitutive material has a surface resistance value of 1.0×E+10Ω or less.
2. The substrate storage container according to claim 1, wherein the internal closed space is set so that a relative humidity therein remains at 10% or less based on the specific constitutive material when left standing in standard atmo- sphere temperature and pressure for 24 hours on a starting basis of a state of the relative humidity of 0%.

3. The substrate storage container according to claim 1, wherein the specific constitutive material has a total amount of outgassing of 40 ppm or less in measuring by a headspace method under a condition at 150 degree C. for 20 minutes.

4. The substrate storage container according to claim 1, wherein the specific constitutive material further comprises a particulate conductive filler (E component) having an n-dibutyl phthalate oil absorption of 180 mL/100 g or more.

5. The substrate storage container according to claim 1, wherein the D component is 5 to 15 parts by mass to 100 parts by mass of the sum of the A component, the B component, and the C component.

6. The substrate storage container according to claim 4, wherein the E component is 1 to 15 parts by mass to the A component of 100 parts by mass.

7. The substrate storage container according to claim 6, wherein the E component is 5 to 12 parts by mass to the A component of 100 parts by mass.

8. A substrate storage container for storing a substrate in an internal closed space thereof, comprising a constitutive material defining the internal closed space, the constitutive material being formed of a specific constitutive material having a water absorption of 0.1 wt. % or less when immersed in water at 23 degree C. for 24 hours,
wherein the specific constitutive material comprises: a single cyclic olefin resin product (A component) of 100 parts by mass; a carbon fiber (B component) of 6 to 14 parts by mass to the A component of 100 parts by mass; and a single polyolefin-based thermoplastic elastomer product as an impact resistance improver (C component) of 12 to 14 parts by mass to the A component of 100 parts by mass or a single polystyrene-based thermoplastic elastomer product as an impact resistance improver (C component) of 5 to 24 parts by mass to the A component of 100 parts by mass,
the polyolefin-based thermoplastic elastomer product is ethylene and 1-butene random copolymers,
the polystyrene-based thermoplastic elastomer product is made by block copolymerizing a polystyrene portion as a hard segment and a portion composed of a polybutylene, a polyethylene, a butadiene, or an isoprene as a soft segment, and
the specific constitutive material has a surface resistance value of $1.0 \times E+10 \Omega$ or less.

* * * * *